United States Patent
Gonska et al.

(10) Patent No.: US 8,530,260 B2
(45) Date of Patent: Sep. 10, 2013

(54) METHOD FOR ATTACHING A FIRST CARRIER DEVICE TO A SECOND CARRIER DEVICE AND MICROMECHANICAL COMPONENTS

(75) Inventors: Julian Gonska, Reutlingen (DE); Axel Grosse, Pfullingen (DE); Heribert Weber, Nuertingen (DE); Ralf Hausner, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 566 days.

(21) Appl. No.: 12/798,868

(22) Filed: Apr. 12, 2010

(65) Prior Publication Data
US 2010/0258884 A1    Oct. 14, 2010

(30) Foreign Application Priority Data
Apr. 14, 2009   (DE) .......................... 10 2009 002 363

(51) Int. Cl.
*H01L 29/84* (2006.01)

(52) U.S. Cl.
USPC ...... 438/51; 438/106; 257/415; 257/E21.002; 257/E29.324; 73/727

(58) Field of Classification Search
None
See application file for complete search history.

(56) References Cited

U.S. PATENT DOCUMENTS

| | | | |
|---|---|---|---|
| 2006/0115323 A1* | 6/2006 | Coppeta et al. | 403/270 |
| 2006/0208326 A1* | 9/2006 | Nasiri et al. | 257/414 |
| 2008/0237823 A1* | 10/2008 | Martin | 257/685 |

* cited by examiner

*Primary Examiner* — Minh-Loan T Tran
*Assistant Examiner* — Fazli Erdem
(74) *Attorney, Agent, or Firm* — Kenyon & Kenyon LLP

(57) ABSTRACT

A method for attaching a first carrier device to a second carrier device includes forming at least one first bond layer and/or solder layer on a first exterior of the first carrier device, a partial surface being framed by the at least one first bond layer and/or solder layer, and placing the first carrier device on the second carrier device and fixedly bonding or soldering the first carrier device to the second carrier device. The at least one first bond layer and/or solder layer includes a first cover area which is larger than a first contact area.

9 Claims, 7 Drawing Sheets

METHOD FOR ATTACHING A FIRST CARRIER DEVICE TO A SECOND CARRIER DEVICE AND MICROMECHANICAL COMPONENTS

BACKGROUND OF THE INVENTION

1. Field of the Invention

The present invention relates to a method for attaching a first carrier device to a second carrier device in producing a micromechanical components.

2. Description of Related Art

In manufacturing a micromechanical component, two or more carrier devices, e.g., wafers and/or substrates, are attached to one another. The carrier devices, which are made of a semiconductor material, plastic, glass and/or a metal and may also be referred to as workpiece carriers, are often attached to one another in such a way that they remain permanently joined in subsequent operation of the micromechanical component.

For fixedly joining the at least two carrier devices, a plurality of wafer-bonding methods is known. In a first category of wafer-bonding methods without using a bond layer as an intermediate layer, chemical and/or physical effects are used for attaching the at least two carrier devices to one another. For example, hydrophilic and hydrophobic surfaces are brought into contact at a temperature above 1000° C. under a high pressure for silicon direct bonding, so that a tight bond is formed between the at least two carrier devices via hydrogen bridges and van der Waals interactions.

In a second category of wafer-bonding methods, at least one bond layer is situated as an intermediate layer between the at least two carrier devices. The at least one bond layer includes a material, a material composition and/or multiple material components, which are fusible by heating and produce a tight bond between the at least two carrier devices after cooling. It is also conceivable for a bond layer, which is brought into contact and heated to form a bond joint having a melting point below or above the melting point of the bond layers, to be situated on the at least two carrier devices. The phase diagram of this bond joint ideally has a eutectic point. For example, a method for eutectic bonding using a germanium layer and an aluminum layer is described in US Patent Application Publication 2006/0208326 A1.

Such wafer-bonding methods of the second category may additionally be used to produce an electrical contact between two carrier devices. For example, bond pads are provided as an intermediate layer on the first carrier device. The second carrier device is then attached to the bond pads, which function as electrical contacts.

However, problems often occur in fusing at least one bond layer situated between two carrier devices, preventing a tight bond from being formed between the two carrier devices and/or resulting in damage to a function-carrying structure on one of the two carrier devices due to the molten material of the at least one bond layer. In eutectic bonding, for example, an oxide layer between two adjacent bond layers may prevent mixing of the materials to form a bond-joining layer. It is therefore desirable to have an inexpensive option for ensuring advantageous mixing and/or spreading behavior of the material of the at least one bond layer in a bonding method.

BRIEF SUMMARY OF THE INVENTION

The present invention provides a method for attaching a first carrier device to a second carrier device in producing a micromechanical component.

The present invention is based on the finding that in a bonding or soldering method, improved mixing and/or spreading behavior of the molten material of the at least one first bond layer and/or solder layer is implementable by modifying the shape of the at least one first bond layer and/or solder layer and/or the area surrounding the partial surface of at least one of the two carrier devices.

For example, traditional bonding or soldering methods make high demands of the surface purity and/or freedom from particles of the at least one first bond layer and/or solder layer. Thus, in eutectic bonding, for example, oxide layers on at least one of two bond layers may prevent the eutectic from developing. Inexpensive mass production of micromechanical sensors and actuators from at least two carrier devices at the highest possible yields is therefore possible only with difficulty in the related art.

This problem is solvable through the present invention. By forming the at least one first bond layer and/or solder layer having a shape in which the first cover area is larger than the first contact area, the pressure between the first contact area and the second contact area is increased. Thus, a surface layer on a bond layer and/or a solder layer, which would traditionally interfere with the bonding or soldering method, may be broken up by the high pressure.

In addition, the present invention solves the problem which often occurs with traditional bonding or soldering methods, namely that at least one of the two carrier devices has a nonplanar surface. The uneven surface may be caused, for example, by bending (BOW), by waviness due to grinding (WARP), a total thickness variation (TTV) and/or by local structuring of the surface or of the layered structure beneath the surface. For example, if the local spacing of the bond layers is greater than their total thickness in a eutectic bonding method, in which the two bond layers are on different surfaces, then a eutectic is able to develop only in spots.

By reducing the first contact area in comparison with the first cover area or the second contact area in comparison with the second cover area, the reduced contact areas may be compressed in the bonding operation, so that contact between the bond layers is implemented everywhere on the substrate.

The problem of the prior art described in the previous paragraph may thus be overcome through the present invention, and in addition, a higher surface pressure on the contact areas is achievable at the same total pressure between the two carrier devices. Any unevenness of at least one of the two carrier devices may thus be compensated for. The method according to the present invention therefore makes lower demands regarding the evenness of the two carrier devices and regarding leveling methods for preparing the two carrier devices.

In addition, at least the partial surface of the first carrier device may be protected from penetration of the molten bonding or soldering material by the at least one bonding- or soldering-temperature-resistant flow-protection surface unevenness. For example, an exterior flow-protection wall, an interior flow-protection wall, an exterior flow-protection trench and/or an interior flow-protection trench may be formed as at least one flow-protection surface unevenness. Improved protection of sensitive sensor components and/or actuator components is thus ensured when performing a bonding or soldering method according to the present invention.

In an advantageous example implementation of the method, the second contact area is formed by forming at least one second bond layer and/or solder layer on a second exterior of the second carrier device. The second contact area of the second carrier device is thus also understood to be a second contact area of at least one second bond layer and/or solder layer.

In a further example refinement, a second cover area of the at least one second bond layer and/or solder layer is formed, at least partially covering the second exterior of the second carrier device, the at least one second bond layer and/or solder layer being formed in such a way that the second contact area is smaller than the second cover layer. This allows an additional increase in the pressure on the two contact areas.

Before forming the at least one first bond layer and/or solder layer and/or the at least one second bond layer and/or solder layer, at least one surface unevenness is advantageously formed on the first exterior and/or on the second exterior, the at least one surface unevenness being covered by the at least one first bond layer and/or solder layer and/or the at least one second bond layer and/or solder layer. For example, a wedge, a step and/or a recess is formed as the at least one surface unevenness.

Likewise, the at least one first bond layer and/or solder layer and/or the at least one second bond layer and/or solder layer may be formed using a varying layer thickness. This is accomplished via an etching method, for example, and/or via local application of bond or solder material. The procedures mentioned here may be implemented in a simple manner.

In another advantageous further refinement, gas escape trenches may be formed on the at least one first bond layer and/or solder layer and/or the at least one second bond layer and/or solder layer, directed away from the partial surface of the first exterior of the first carrier device. In addition, gas escape openings, through which a gas may flow in contacting of the two carrier devices, may also be formed. This ensures that no gas inclusion is formed in the interior of the bond- or solder-joining layer formed from the at least one bond or solder layer.

The advantages described in the previous paragraphs are also ensured with a corresponding micromechanical component.

DETAILED DESCRIPTION OF THE INVENTION

The example implementations of the method described below are advantageous in particular for manufacturing semiconductor components (MEMS, microelectromechanical systems) such as sensors and actuators using SMM (surface micromechanical) technologies. More than two carrier devices may of course also be joined and/or electrical contacts may be formed between the at least two carrier devices by the methods described here.

A eutectic bonding method is preferably used. The eutectic bonding method ensures an adequate strength between at least two carrier devices joined together, easily implementable capping of a sensor and/or actuator and/or good electrical contact between two carrier devices joined together. However, other bonding methods may also be used, e.g., anodic bonding, thermocompression bonding, soldering, glass-frit bonding and/or an adhesive bonding method. The advantages described below may also be implemented through these bonding methods.

FIGS. 1A through 1D show a top view of a carrier device and cross sections through two carrier devices to illustrate a first example implementation of the method according to the present invention.

As an exemplary embodiment, a micromechanical component designed as a rotational rate sensor and/or an acceleration sensor is manufactured by the method described below. However, it is pointed out that the method described here is not limited to manufacturing such a sensor.

Figure 1A:
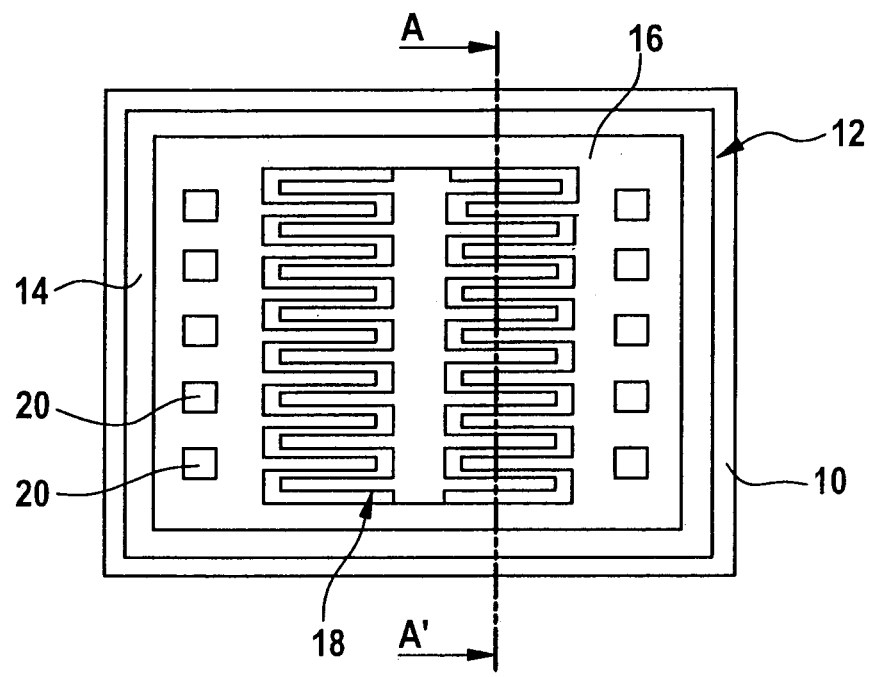
FIGS. 1A through 1D show a top view of a carrier device and cross sections through two carrier devices for illustrating a first example implementation of the method according to the present invention.

First carrier device 10 shown as a sensor chip in a view from above in FIG. 1A is a subunit of the micromechanical component manufactured as described below. First carrier device 10 may preferably be a wafer or a substrate. First carrier device 10 may include, for example, a semiconductor material, a metal, an insulating material and/or glass.

First carrier device 10 has an exterior 12, to which a first bond layer 14 is applied. First bond layer 14 covers first exterior 12 of first carrier device 10, so that a partial surface 16 of first exterior 12 is framed by first bond layer 14. First bond layer 14 may have a frame-shaped base area. However, the present invention is not limited to a first bond layer 14 designed in a frame shape. First bond layer 14 may also have meandering and/or round partial areas, for example.

A function-carrying structure 18 of first carrier device 10 is preferably formed on partial surface 16. Function-carrying structure 18 may be etched into an area of first carrier device 10 covered by partial surface 16, for example, and/or manufactured by applying layers of at least one conductive and/or insulating material. For example, function-carrying structure 18 includes a seismic mass, an actuator electrode, a stator electrode and/or contacts 20. Contacts 20 may be formed, for example, by applying a conductive layer and subsequent structuring of the conductive layer. However, the specific embodiment described here is not limited to such a function-carrying structure 18. As an alternative or in addition, first carrier device 10 may include at least one additional function structure, e.g., an electrical analyzer circuit.

Figure 1B:
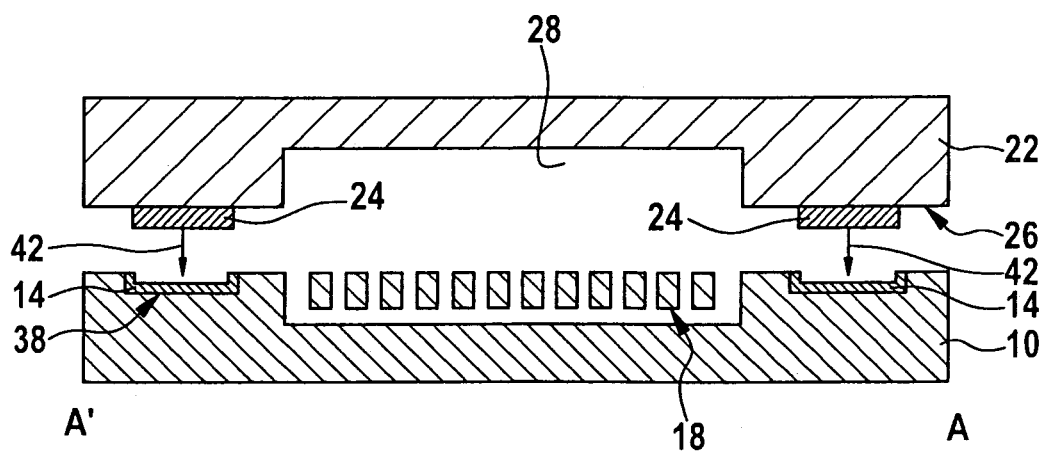
Figure 1C:
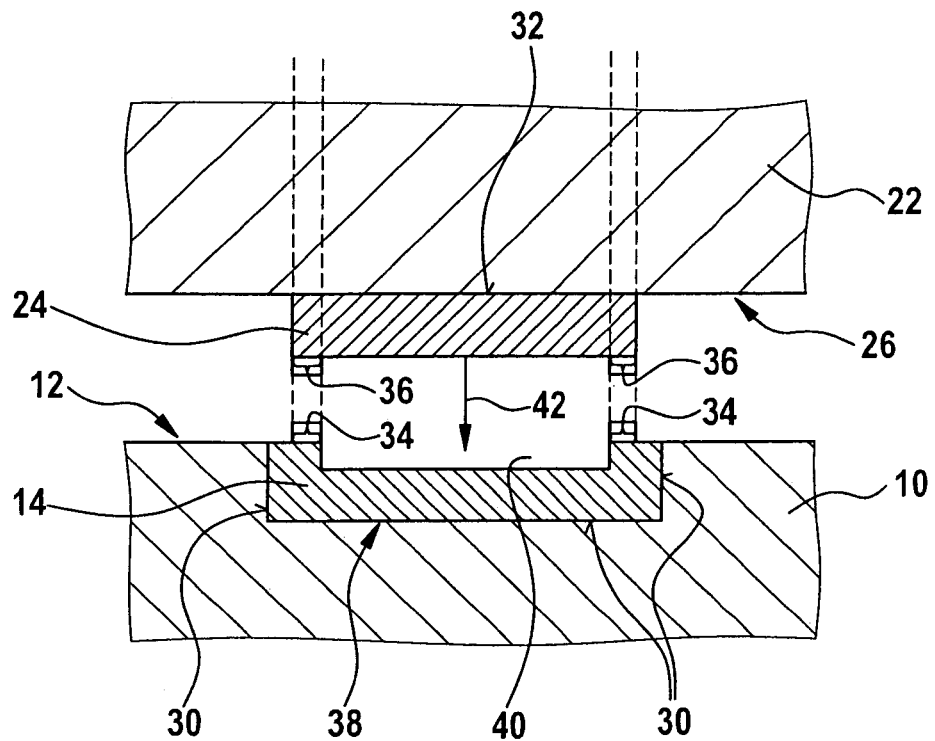
Figure 1D:
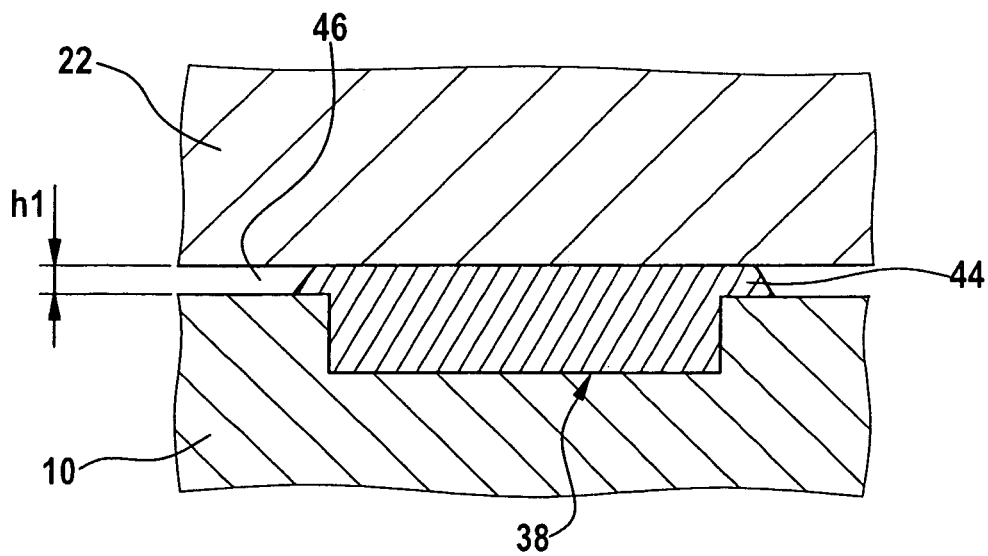

FIGS. 1B through 1D show cross sections through first carrier device 10 and a second carrier device 22 along line AA' in FIG. 1A. In the example shown here, second carrier device 22 is a cap wafer having a cavity 28. The position and size of cavity 28 preferably correspond to the position and size of function-carrying structure 18. Rotational rate sensors, acceleration sensors and/or pressure sensors having a cap may thus be manufactured by the method described here.

It is pointed out here that the design of second carrier device 22 as a cap wafer having cavity 28 is to be understood merely as an example. As an alternative to that, second carrier device 22 may also include a glass, a semiconductor substrate, e.g., GaAs, Ge, SiC, a metal and/or an insulating material. Likewise, an ASIC (Application Specific Integrated Circuit) as a second carrier device 22 may be joined mechanically and/or electrically to first carrier device 10.

The first example implementation of the method for attaching second carrier device 22 to first carrier device 10 is described below with reference to FIGS. 1B through D.

In a first method step, a recess 38 is etched into first exterior 12 of first carrier device 10. Recess 38 preferably frames partial surface 16 having function-carrying structure 18.

First bond layer 14 already described is then formed on first carrier device 10. Recess 38 is then filled with the material of first bond layer 14, so that a contacting side of first bond layer 14 facing away from first carrier device 10 has an indentation 40 (see FIG. 1C).

In addition, a second bond layer 24 is applied to a second exterior 26 of second carrier device 22 in a preceding or subsequent method step. Second bond layer 24 is preferably applied to second exterior 26 in such a way that second bond layer 24 frames cavity 28.

For more accurate description of the embodiment of first bond layer 14 and second bond layer 24, reference is made to the enlargement of a partial area of FIG. 1B shown in FIG. 1C.

As shown in FIG. 1C, a first cover area 30 of first bond layer 14 contacts first exterior 12 of first carrier device 10. Accordingly, a second cover area 32 of second bond layer 24 contacts second exterior 26 of second carrier device 22.

According to arrow 42, both carrier devices 10 and 22 are situated on top of one another in a further method step, so that a first contact area 34 of first bond layer 14 contacts a second contact area 36 of second bond layer 24. First bond layer 14 and second bond layer 24 are shaped so that in contacting both bond layers 14 and 24, a first contact area 34 of first bond layer 14 contacts a second contact area 36 of second bond layer 24.

Both bond layers 14 and 24 are designed in such a way that first contact area 34 is smaller than first cover area 30 and/or second contact area 36 is smaller than second cover area 32. First contact area 34 is preferably smaller than first cover area 30, and second contact area 36 is preferably smaller than second cover area 32.

First contact area 34 is to be understood to refer, for example, to the totality of all partial areas of first bond layer 14, which contacts second bond layer 24 after first carrier device 10 approaches second carrier device 22. Accordingly, second contact area 36 may include the totality of all partial areas of second bond layer 24, which contact first bond layer 14 after second carrier device 22 is placed on first carrier device 10.

Recess 38 ensures that first contact area 34 may be substantially reduced with respect to first cover area 30, and second contact area 36 may be substantially reduced with respect to second cover area 32. The position of recess 38 is selected in such a way that indentation 40 is at least partially situated beneath a contacting side of second bond layer 24 facing away from second exterior 26 after contacting of both bond layers 14 and 24. This prevents one of the two contacting sides from completely covering the other contacting side in contacting two bond layers 14 and 24.

As an alternative or in addition to recess 38, there is the possibility of forming at least one protruding surface structure on first exterior 12 of first carrier device 10. Likewise, another recess and/or a protruding surface structure may also be formed on second exterior 26 of second carrier device 22. The at least one protruding surface structure and/or additional recess is/are then at least partially covered by first bond layer 14 and/or second bond layer 24.

Because of the small size of contact areas 34 and 36, a pressure prevailing on contact areas 34 and 36 in contacting bond layers 14 and 24 is increased significantly in comparison with cover areas 30 and 32. In a subsequent method step, two bond layers 14 and 24 are made to melt at contact areas 34 and 36 by raising the temperature. The deformation and the flow rate of the molten materials of bond layers 14 and 24 are greater due to the increased pressure. Good mixing of the molten materials of two bond layers 14 and 24 is thus ensured by the reduced size of contact areas 34 and 36. In particular, the pressure on contact areas 34 and 36 may be high enough to break open a layer, e.g., an oxide layer, on a contacting side of a bond layer 14 and/or 24.

A bond-joining layer 44 is formed from the materials of bond layers 14 and 24 in this way. Bond-joining layer 44 ensures a tight connection between the two carrier devices 10 and 22. At the same time, penetration of particles and/or a liquid into the void composed of cavity 28 and the recesses of function-carrying structure 18 is prevented by bond-joining layer 44, which surrounds function-carrying structure 18 and cavity 28 like a frame.

In an example embodiment, bond-joining layer 44 is made of an airtight material, thus ensuring that a gap 46 between two carrier devices 10 and 22 having a first height h1 is sealed in an airtight manner. The void including cavity 28 and the recesses of function-carrying structure 18 is thus hermetically sealed off from the exterior environment of the two carrier devices 10 and 22. At least one additional bond frame may optionally be manufactured by the method described here to improve the hermetic seal.

First bond layer 14 and/or second bond layer 24 may be made of germanium and/or aluminum, for example. One of two bond layers 14 or 24 is preferably made of germanium, while the other of two bond layers 14 or 24 is made of aluminum. The germanium and aluminum materials are suitable for eutectic bonding in particular because the use of these materials ensures a reliable hermetic seal of the void with respect to the external environment of carrier devices 10 and 22.

In a traditional bonding method, the high demands of surface purity and a suitable topography of the top sides of bond layers 14 and 24 present a major problem in creating a hermetically sealed bond-joining layer 44. Because of the small dimension of contact areas 34 and 36 in comparison with cover areas 30 and 32, this problem is eliminated by the method according to the present invention.

Figure 2:
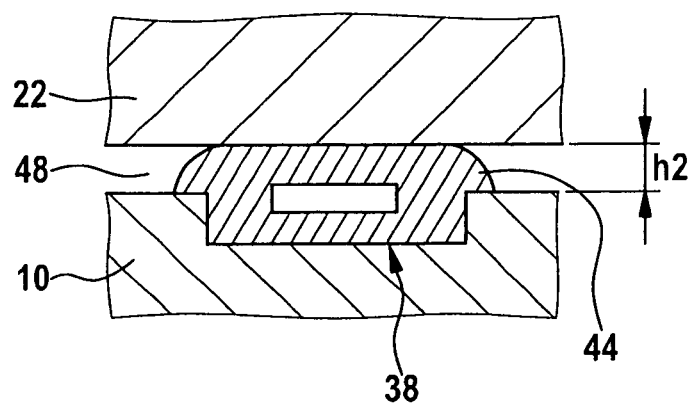
FIG. 2 shows a cross section through two carrier devices for illustrating an advantage of the first example implementation of the method.

FIG. 2 shows a cross section through two carrier devices to illustrate an advantage of the first example implementation of the method according to the present invention.

Gap 48 in FIG. 2 having a second height h2 between two carrier devices 10 and 22, which have been brought into contact, is much larger than gap 46 having first height h1 shown in FIG. 1D. Because of the specific structuring of the two bond frames, the method described above may nevertheless be implemented with no problem. Thus, despite gap 48 having an increased second height h2, the materials of both bond layers 14 and 24 may be brought into contact and combined. This ensures formation of a bond-joining layer 44, which bonds two carrier devices 10 and 22 fixedly together after cooling.

As those skilled in the art will recognize on the basis of FIGS. 1D and 2, a micromechanical component manufactured by the example implementation of the method described above will have recess 38 covered by bond-joining layer 44 on first exterior 12 of first carrier device 10. FIGS. 1D and 2 thus also disclose a first example embodiment of the micromechanical component.

Figure 3:
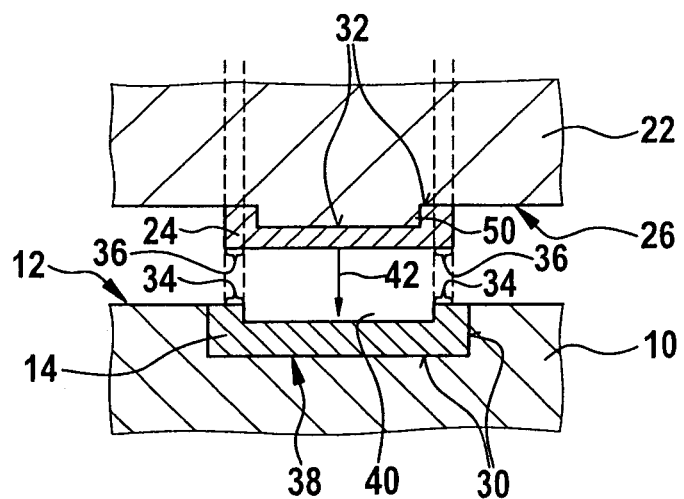
FIG. 3 shows a cross section through two carrier devices for illustrating a second example implementation of the method according to the present invention.

FIG. 3 shows a cross section through two carrier devices to illustrate a second example implementation of the method according to the present invention.

The second example implementation is a further refinement of the method of FIG. 1. In an additional method step, a step 50 is formed on second exterior 26 of second carrier device 22. This is accomplished via an additional application of at least one additional material to second exterior 26 and/or by etching exterior 26, for example. The position and size of step 50 preferably correspond to the position and size of recess 38.

Step 50 is then at least partially covered by second bond layer 24, thus ensuring the advantageous reduction in contact areas 34 and 36 in comparison with cover areas 30 and 32 of bond layers 14 and 24. The method of FIG. 3 thus ensures the advantages described here.

In particular, the dimensions of step 50 and of recess 38 perpendicular to their heights may be selected in such a way that the dimension of step 50 is greater than or equal to the dimension of indentation 40 on the contacting side of first bond layer 14. This example embodiment of indentation 40 and step 50 facilitates adjustment of two carrier devices 10 and 22 in a preferred position relative to one another and prevents two carrier devices 10 and 22 from slipping during the bonding operation. This makes a self-adjustment of two carrier devices 10 and 22 into the preferred position implementable.

In addition, recess 38 and step 50 function as denticulation between two carrier devices 10 and 22 after a bond-joining layer 44 has been manufactured by mixing the materials of bond layers 14 and 24. The denticulation ensures an improved resistance of the micromechanical component of two carrier devices 10 and 22 with respect to shearing forces. Additional advantages of the denticulation of recess 38 and step 50 include an easily implementable automatic adjustment of two carrier devices 10 and 22 into a preferred position in relation to one another, an increased robustness of the finished micromechanical component having the denticulation and a local excess pressure due to the reduced seating area/reduced contact areas 34 and 36. The formation of the eutectic (bond-joining layer 44) of bond layers 14 and 24 is facilitated by a local excess pressure.

A nub, a pointed wedge and/or a blunt wedge may be formed on exterior 26 as an alternative or in addition to step 50. The design of a pointed wedge and/or a blunt wedge in particular facilitates the self-adjustment of two carrier devices 10 and 22 into the preferred position with a corresponding adjustment of recess 38.

The micromechanical component manufactured by the method of FIG. 3 is recognizable as a second example embodiment of the micromechanical component on the basis of the denticulation between two carrier devices 10 and 22 formed from recess 38 and step 50.

Figure 4:
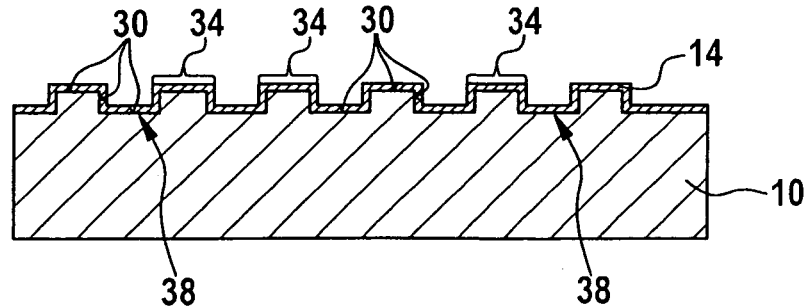
FIG. 4 shows a cross section through a carrier device for illustrating a third example implementation of the method according to the present invention.

FIG. 4 shows a cross section through a carrier device to illustrate a third example implementation of the method according to the present invention.

In the third example implementation of the method, multiple recesses 38 are formed on first exterior 12 of a first carrier device 10. Recesses 38 are preferably etched into first exterior 12. The example embodiment is not limited to the number of recesses 38 shown here.

As an alternative or in addition to recesses 38, steps, nubs, pointed wedges and/or blunt wedges may be formed on first exterior 12, e.g., by applying at least one material and/or by an etching method. The surface unevenness in the form of recesses 38, steps, nubs, pointed wedges and/or blunt wedges advantageously has an equidistant spacing.

In another method step, first bond layer 14 is applied to the surface unevenness. First bond layer 14 formed in this way has a first contact area 34, which is definitely smaller in comparison with cover area 30. Thus, a first bond layer 14 having an advantageous reduction in the first contact area in comparison with cover area 30 is manufactured easily and inexpensively by the method illustrated in FIG. 4.

As those skilled in the art will see on the basis of FIG. 4, the method according to the present invention may also be used for a bonding method using only one bond layer 14.

In a particularly advantageous example implementation, the surface unevenness is formed by a material which does not form the eutectic and is resistant to the bonding temperature. Such a material may be structured silicon, for example. In this case, the surface unevenness forms stop structures, which define an advantageous distance between two carrier devices 10 and 22 and curb the speed of the eutectic.

In a further refinement of the advantageous example implementation, a surface structure corresponding to the surface unevenness may be formed on second carrier device 22 (not shown). This allows an additional reduction in contact areas 34.

Likewise, an auto-adjust function is implementable in this way. In addition, after joining two carrier devices 10 and 22, the surface unevenness of first carrier device 10 and the surface structure of second carrier device 22 may form a denticulation between two carrier devices 10 and 22. A micromechanical component having a greater robustness with respect to shearing forces is implementable in this way.

Those skilled in the art will be able to recognize a third example embodiment of the micromechanical component at least on the basis of the surface unevenness in first carrier device 10, such as recesses 38, which are covered by a bond-joining layer 44 formed at least from the material of first bond layer 14.

Figure 5:
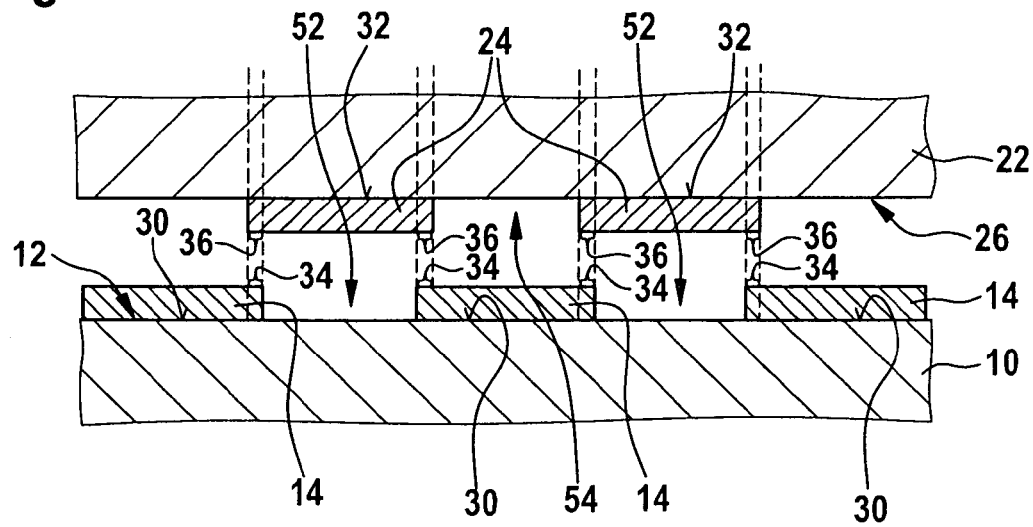
FIGS. 5 and 6 show a cross section through two carrier devices for illustrating a fourth and fifth example implementations of the method according to the present invention.

FIG. 5 shows a cross section through two carrier devices to illustrate a fourth example implementation of the method according to the present invention.

In the method described with reference to FIG. 5, first bond layer 14 and second bond layer 24 are applied to unstructured partial areas of first exterior 12 of first carrier device 10 and second exterior 26 of second carrier device 22. However, it is pointed out that at least one of the areas of exteriors 12 and 26 covered by bond layers 14 and 24 may be structured in a further refinement of the method.

To implement a reduction in contact areas 34 and 36 with respect to cover areas 30 and 32, recesses 52 and 54 are formed in first bond layer 14 and in second bond layer 24. For example, recesses 52 and 54 are etched throughout into first bond layer 14 and into second bond layer 24.

Recesses 52 and 54 are preferably formed equidistantly in first bond layer 14 and second bond layer 24, one dimension of recesses 52 and 54 being smaller than the distance between two neighboring recesses 52 or 54. The positions of recesses 52 and 54 may correspond to one another, so that in contacting of bond layers 14 and 24, each opening in recesses 52 is covered by bond layer 24, and each opening in recesses 54 is covered by bond layer 14. There are thus overlap areas between bond layers 14 and 24 in contacting of bond layers 14 and 24, where contact areas 34 and 36 of bond layers 14 and 24 come into contact.

An increased tolerance to surface topographies is achieved through the multiple repetitions of recesses 52 and 54 illustrated in FIG. 5. In a closed bond frame, this prevents the probability of occurrence of a leak and thus the risk of failure of the component.

The method illustrated in FIG. 5 offers the advantages of increased pressure on contact areas 34 and 36 as described above due to the reduction in contact area 34 in comparison with cover area 30 and a reduction in contact area 36 in comparison with cover area 32. For example, oxide layers, which traditionally prevent mixing of the materials of bond layers 14 and 24, may be broken up mechanically on reduced contact areas 34 and 36. In addition, the method presented here offers a simplified and thus inexpensive process management.

Figure 6:
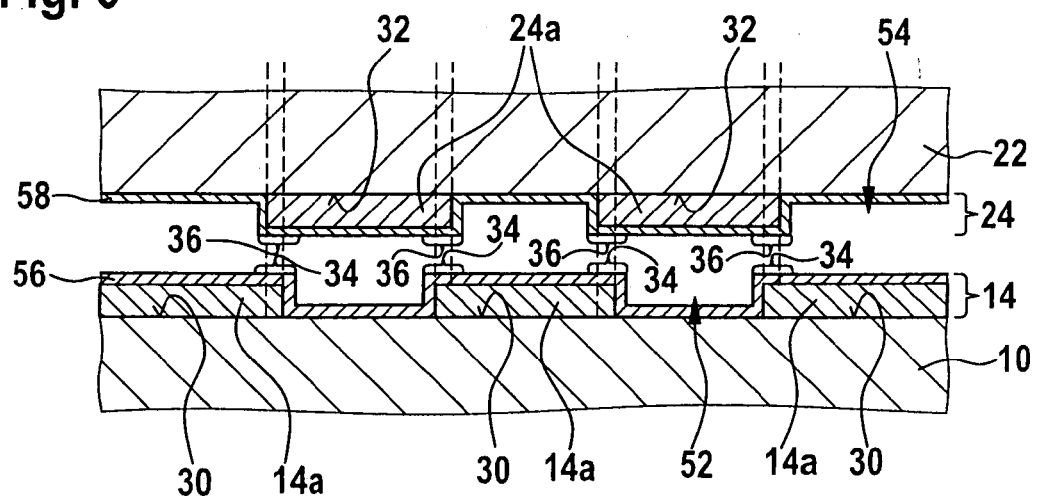

FIG. 6 shows a cross section through two carrier devices to illustrate a fifth example implementation of the method according to the present invention.

The method described with reference to FIG. 6 is a further refinement of the method of FIG. 5. A first structured bond material layer 14a and a first cover layer 56 are applied as first bond layer 14 to first carrier device 10. Recesses 52 formed in first structured bond material layer 14a correspond to the previous example embodiment. First cover layer 56 preferably completely covers first structured bond material layer 14a. Accordingly, a second structured bond material layer 24a and a second cover layer 58 are formed as second bond layer 24 on second carrier device 22.

Covering of bond material layers 14a and/or 24a using cover layers 56 and 58 immediately after application/structuring of bond material layers 14a and/or 24a is advantageous in particular using bond material layers 14a and/or 24a made of an easily oxidizable material, e.g., silicon and/or aluminum.

For example, a sputtering process may be used for deposition of cover layers 56 and/or 58. In the sputtering process, the oxide is preferably deposited first on particular bond material layer 14a or 24a by backsputtering before deposition of cover layer 56 or 58. Example of materials for a cover layer 56 or 58 include silicon, germanium, aluminum, aluminum-silicon compounds, aluminum-silicon-copper compounds, gold, tin, titanium, chromium and/or copper.

In an example implementation, first cover layer 56 is formed from the material of second bond material layer 24a. Accordingly, the material of first bond material layer 14a is used for second cover layer 58. In particular, the maximum layer thicknesses of cover layers 56 and 58 may be much smaller than the maximum layer thicknesses of bond material layers 14a and/or 24a. Thus, cover layers 56 and 58 melt first with a rise in temperature during the bonding operation. A melt capable of equalizing topographies is then formed. In the remaining course of the bonding operation, the melts of all layers 14a, 24a, 56 and 58 react with one another, forming a bond-joining layer 44 between two carrier devices 10 and 22.

Figure 7:
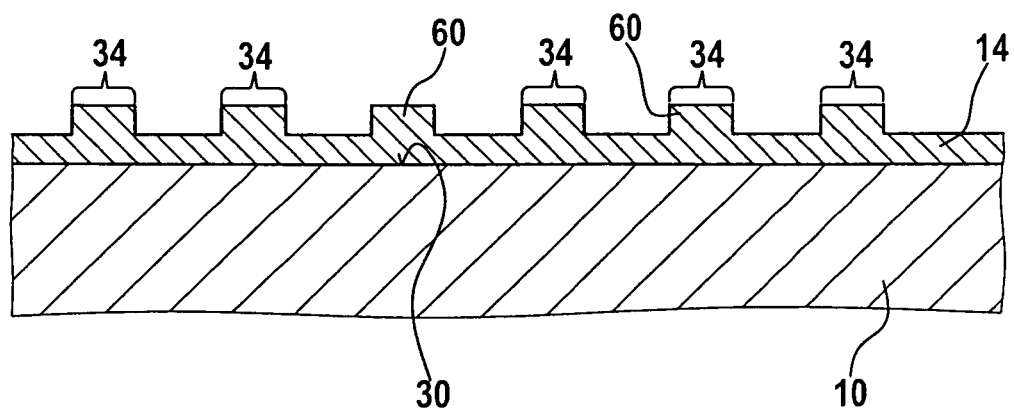
FIG. 7 shows a cross section through a carrier device for illustrating a sixth example implementation of the method according to the present invention.

FIG. 7 shows a cross section through a carrier device to illustrate a sixth example implementation of the method according to the present invention.

In the sixth example implementation, a first bond layer 14 having a variable layer thickness is formed on first carrier device 10. For example, after applying the material of first bond layer 14, non-through recesses are etched in first bond layer 14. Alternatively or additionally, a material may be deposited locally on first bond layer 14. Protruding surface structures such as steps 60 as shown here or recesses may thus be formed on first bond layer 14 in this way in particular. The protruding surface structures may advantageously be formed from the material of first bond layer 14.

First contact area 34 of first bond layer 14 is reduced in comparison with first cover area 30 due to the design of a first bond layer 14 having a variable layer thickness. This ensures the advantages already described.

Figure 8:
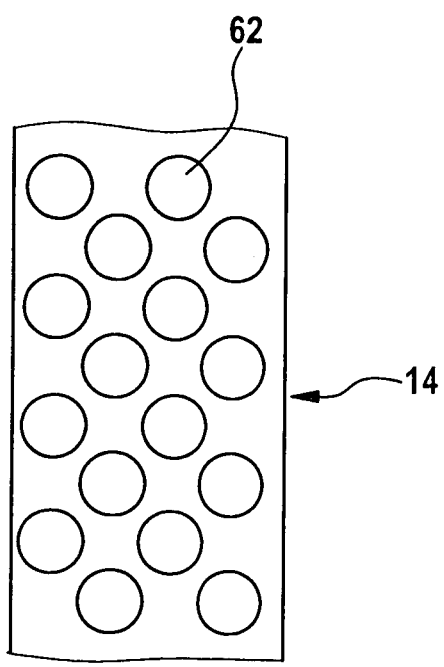
FIGS. 8 and 9 show top views of a bond layer for illustrating a first and second examples of surface structures formed on the bond layer.

FIG. 8 shows a top view of a bond layer to illustrate a first example of surface structures formed on the bond layer.

In FIG. 8, first bond layer 14 has steps 62 having a round base area as the protruding structures. Steps 62 on first bond layer 14 preferably form a pattern of dots. Steps 62 having the round base area may be formed, for example, by etching away material and/or by local deposition on first bond layer 14, for example.

Figure 9:
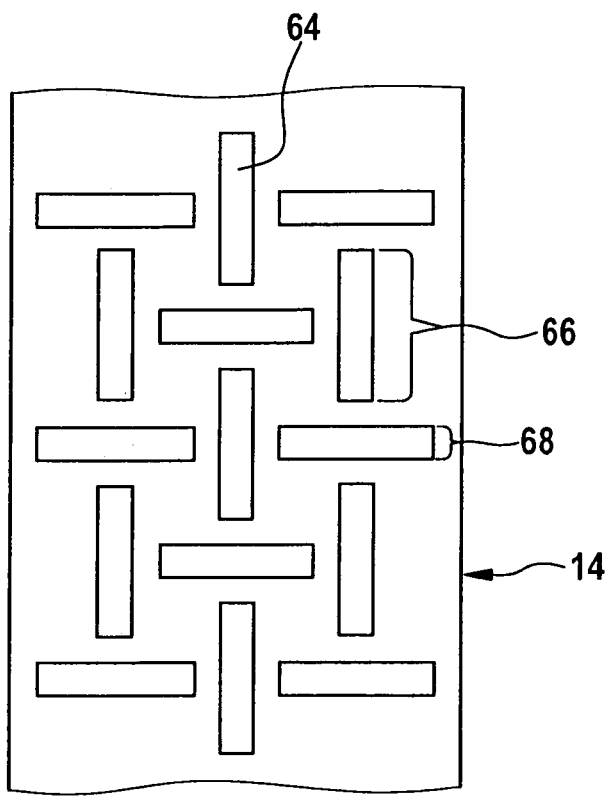

FIG. 9 shows a top view of a bond layer to illustrate a second example of surface structures formed on the bond layer.

First bond layer 14 shown in FIG. 9 has steps 64 having a rectangular base area as the protruding surface structures. In particular, a first dimension of first side areas 66 of steps 64 is much larger than a second dimension of second side areas 68 of steps 64. Steps 64 are situated in relation to one another in such a way that a first side area 66 of a first step 64 is aligned adjacent to a second side area 68 of an adjacent second step 64.

Figure 10:
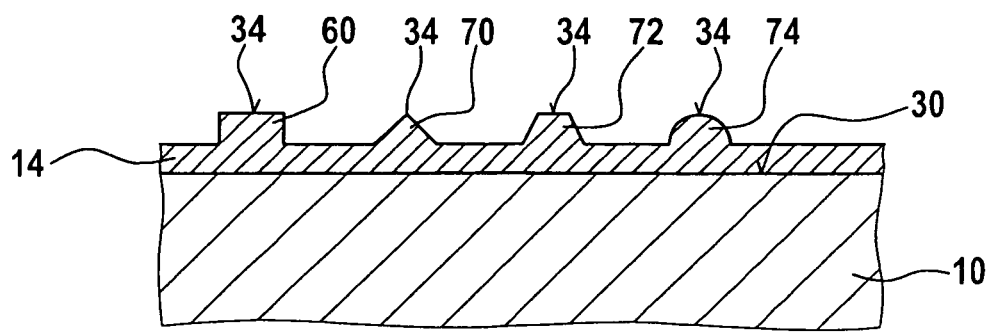
FIG. 10 shows a cross section through a carrier device for illustrating a seventh example implementation of the method according to the present invention.

FIG. 10 shows a cross section through a carrier device to illustrate a seventh example implementation of the method according to the present invention.

First bond layer 14 having a varying layer thickness may also have a pointed wedge 70, a blunt wedge 72 and/or an outward bulge 74 instead of and/or in addition to steps 60 through 64 as the protruding surface structure. Surface structures 60, 70, 72 and 74 suggested here are manufactured easily and inexpensively by etching procedures and/or by local application of the material of first bond layer 14. Likewise, a concavity may also be etched into first bond layer 14. The advantages ensured by the reduction in first contact area 34 in comparison with first cover area 30 are thus easily implementable.

For those skilled in the art, additional examples of possible surface unevenness in first bond layer 14 and/or second bond layer 24 are suggested on the basis of FIGS. 7, 8, 9 and 10. Therefore, additional examples of protruding surface structures/recesses in bond layers 14 and/or 24 will not be discussed in greater detail here.

In a further refinement of a method according to FIGS. 7, 8, 9 and 10, the shape of second bond layer 24 may be adapted to first bond layer 14. This allows a self-adjustment of the two carrier devices 10 and 22.

Figure 11:
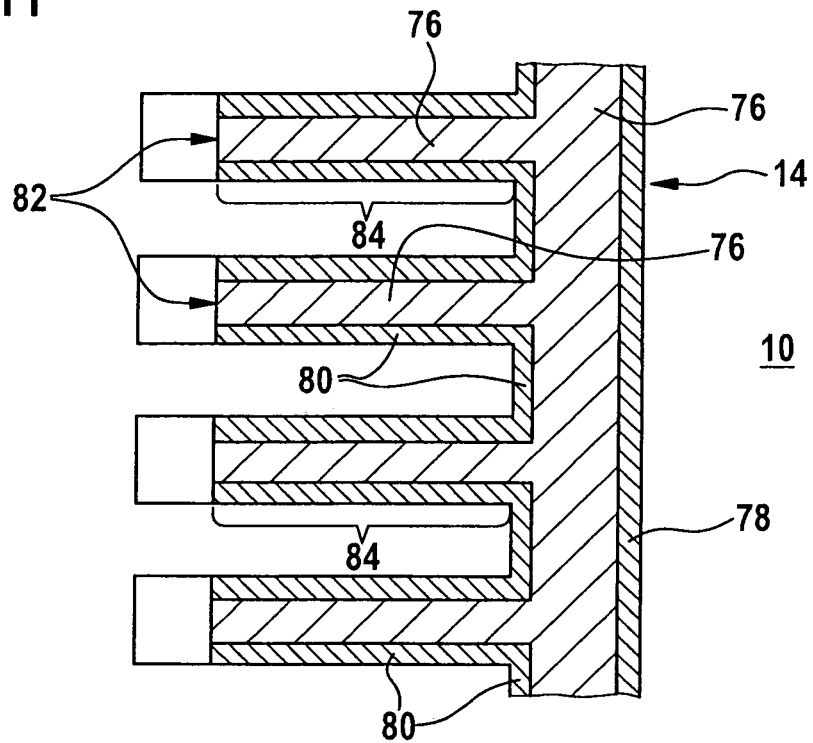
FIG. 11 shows a top view of a bond layer for illustrating an eighth example implementation of the method according to the present invention.

FIG. 11 shows a top view of a bond layer to illustrate an eighth example implementation of the method according to the present invention.

First bond layer 14 shown in FIG. 11 has a contacting side facing away from first carrier device 10, gas escape trenches/venting trenches 76 being formed thereon. The recesses embodied as gas escape trenches 76 are partially surrounded by side walls 78 and 80 made of the material of first bond layer 14. At least one of side walls 78 and 80 may have at least one gas escape opening 82. Gas escape openings 82 preferably have a maximum height equal to the maximum height of gas escape trenches 76 and/or are directed away from framed partial surface 16 of first carrier device 10.

In an example embodiment, a first side wall 78 which is situated adjacent to partial surface 16 of first carrier device 10 framed by first bond layer 14 does not have any openings formed as gas escape openings 82. On the other hand, gas escape openings 82 directed away from framed partial surface 16 of first carrier device 10 are formed in second side wall 80.

In a traditional bonding method, which is not performed in a vacuum, gas inclusions (blowholes) are frequently formed in resulting bond-joining layer 44. These gas inclusions reduce the stability of manufactured bond-joining layer 44 and thus influence its lifetime/stability. A temperature change may thus result in damage to bond-joining layer 44 because the volume of the gas inclusions also changes with varying temperatures.

To overcome this traditional disadvantage, in the method described here, gas escape trenches 76 described above are formed on the contacting side of first bond layer 14, gas escape openings 82 preferably being situated in such a way that the gas escape openings are at least partially not covered after contacting of first bond layer 14 with a second carrier device 22 (not shown). Thus, a compressed gas is able to escape through gas escape trenches 76 and gas escape openings 82. Gas escape trenches 76 thus ensure a greater stability of bond-joining layer 44 manufactured by the method described here.

In a particularly advantageous example embodiment, first bond layer 14 is formed with gas outlet extensions 84, which are situated with a first end on first bond layer 14 and their second end directed away from framed partial surface 16 of first carrier device 10. Gas escape trenches 76 preferably additionally extend along gas outlet extensions 84, so that at least some gas escape openings 82 are formed on the second ends of gas outlet extensions 84.

For those skilled in the art, method steps for forming at least one gas escape trench 76, one gas escape opening 82 and/or one gas outlet extension 84 on first bond layer 14 and/or on second bond layer 24 (not shown here) are suggested by FIG. 11 and the descriptions given above, so these will not be described further here.

Figure 12:
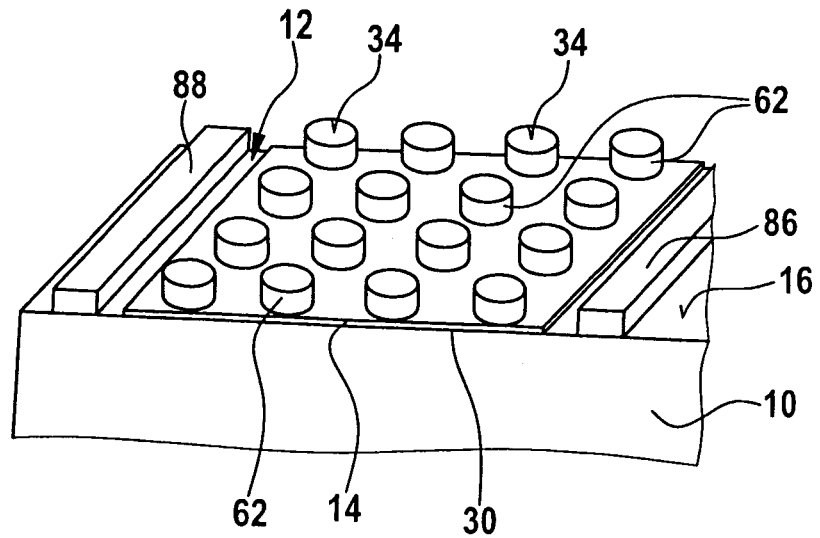
FIG. 12 shows a top view of a carrier device for illustrating a ninth example implementation of the method according to the present invention.

FIG. 12 shows a top view of a carrier device to illustrate a ninth example implementation of the method according to the present invention.

In the method shown in FIG. 12, at least one temperature-resistant flow-protection surface unevenness 86 and 88 is formed on first exterior 12 of first carrier device 10 and/or on second exterior 26 (not shown) of second carrier device 22. At least one flow-protection surface unevenness 86 and 88 frames partial surface 16 of first exterior 12 having function-carrying structure 18 (not shown) and thus protects function-carrying structure 18 from penetration of molten material of at least one first bond layer 14.

An interior flow-protection wall 86 and an exterior flow-protection wall 88 are advantageously formed on first exterior 12. Interior flow-protection wall 86 is framed by first bond layer 14. Exterior flow-protection wall 88 frames interior flow-protection wall 86 together with first bond layer 14. Flow-protection walls 86 and 88 may be manufactured from a material which remains solid at the temperature used for melting at least one first bond layer 14 and does not form a eutectic. As an alternative or in addition to at least one of two flow-protection walls 86 and/or 88, an exterior flow-protection trench and/or an interior flow-protection trench may also be formed. At least one flow-protection wall 86 or 88 or flow-protection trench is preferably situated to allow contact with neighboring bond layer 14. This ensures that spread of the eutectic is prevented. Methods for forming at least one flow-protection wall 86 or 88 or one flow-protection trench will be self-evident for those skilled in the art from FIG. 12.

In addition, first contact area 34 of first bond layer 14 may be reduced in comparison with cover area 30 of first bond layer 14 by the method described above. The advantages described above are additionally implementable in this way.

In a further example refinement of the method of FIG. 12, at least one flow-protection wall 86 or 88 is formed on first carrier device 10. At least one flow-protection trench, the position and size of which corresponds to the position and size of particular flow-protection wall 86 or 88, is formed on second carrier device 22 attached to first carrier device 10 in another method step. Thus, at least one denticulation between two carrier devices 10 and 22 is easily implementable via at least two flow-protection surface unevennesses 86 or 88 corresponding to one another in their positions and sizes. An improved robustness of the micromechanical component manufactured from two carrier devices 10 and 22 with respect to shearing forces is ensured by the at least one denticulation.

FIG. 12 also suggests to those skilled in the art an example embodiment of the micromechanical component having at least two carrier devices 10 and 22 attached to one another via at least one bond- and/or solder-joining layer and at least one bond- and/or solder-temperature-resistant flow-protection surface unevenness. As those skilled in the art will recognize on the basis of FIG. 12, the at least one bond- and/or solder-joining layer and the at least one bond- and/or solder-temperature-resistant flow-protection surface unevenness frame a partial surface 16 of first exterior 12 of first carrier device 10. The example embodiment of the micromechanical component thus has the advantage that no material of the at least one bond- and/or solder-joining layer has penetrated into partial surface 16 of first exterior 12 of first carrier device 10. A function-carrying structure 18 formed in partial surface 16 of first exterior 12 thus has a functionality unimpaired by the bonding method.

As those skilled in the art will recognize, the methods described in the previous sections are also suitable for manufacturing at least two bond-joining layers 44, of which a first bond-joining layer 44 frames at least one second bond-joining layer 44. The probability of a leaky component due to a leak in one of at least two bond-joining layers 44 is reduced by forming at least two bond-joining layers 44.

What is claimed is:

1. A method for attaching a first carrier device to a second carrier device, comprising:

forming a recess in a first exterior of a first carrier device;

filling the recess with at least one of a first bond layer and a first solder layer so that a contacting side of that at least one of the first bond layer and the first solder layer facing away from the first carrier device has an indentation, wherein the at least one of the first bond layer and the first solder layer includes a first cover area at least partially covering the first exterior of the first carrier device, and wherein a partial surface of the first exterior of the first carrier device is framed by the at least one of the first bond layer and the first solder layer;

placing the first carrier device having the at least one of the first bond layer and the first solder layer on the second carrier device in such a way that a first contact area of the at least one of the first bond layer and the first solder layer contacts a second contact area of the second carrier device; and one of fixedly bonding or fixedly soldering the first carrier device to the second carrier device;

wherein the at least one of the first bond layer and the first solder layer is formed in such a way that the first cover area is shaped larger than the first contact area.

2. The method as recited in claim 1, wherein the second contact area is formed by forming at least one of a second bond layer and a second solder layer on a second exterior of the second carrier device, and wherein the at least one of the second bond layer and the second solder layer includes a second cover area at least partially covering the second exterior of the second carrier device, and wherein the at least one of the second bond layer and the second solder layer is formed in such a way that the second contact area is shaped to be smaller than the second cover layer.

3. The method as recited in claim 2, wherein:

before forming the at least one of the first bond layer and the first solder layer, at least one surface unevenness is formed on the first exterior; and the at least one surface unevenness is covered by the at least one of the first bond layer and the first solder layer.

4. The method as recited in claim 3, wherein the at least one of the first bond layer and the first solder layer is formed using a varying layer thickness.

5. The method as recited in claim 4, wherein at least one gas escape trench is formed on the at least one of the first bond layer and the first solder layer, and wherein the at least one gas escape trench faces away from the partial surface of the first exterior of the first carrier device.

6. The method as recited in claim 2, wherein before placing the first carrier device on the second carrier device, at least one of bond-temperature-resistant flow-protection surface unevenness and solder-temperature-resistant flow-protection surface unevenness is formed on at least one of the first exterior and the second exterior, and wherein the at least one of the bond-temperature-resistant flow-protection surface unevenness and the solder-temperature-resistant flow-protection surface unevenness frames the partial surface of the first exterior of the first carrier device after the first carrier device is placed on the second carrier device.

7. A method for attaching a first carrier device to a second carrier device, comprising:

forming a recess in a first exterior of a first carrier device;

filling the recess with at least one of a first bond layer and a first solder layer so that a contacting side of that at least one of the first bond layer and the first solder layer facing away from the first carrier device has an indentation, wherein a partial surface of the first exterior of the first carrier device is framed by the at least one of the first bond layer and the first solder layer;

placing the first carrier device having the at least one of the first bond layer and the first solder layer on the second carrier device in such a way that a first contact area of the at least one of the first bond layer and the first solder layer contacts a second contact area of the second carrier device; and one of fixedly bonding or fixedly soldering the first carrier device to the second carrier device;

wherein before placing the first carrier device on the second carrier device, at least one of bond-temperature-resistant flow-protection surface unevenness and solder-temperature-resistant flow-protection surface unevenness is formed on at least one of the first exterior and the second exterior, and wherein the at least one of the bond-temperature-resistant flow-protection surface unevenness and the solder-temperature-resistant flow-protection surface unevenness frames the partial surface of the first exterior of the first carrier device after the first carrier device is placed on the second carrier device.

8. The method as recited in claim 7, wherein the at least one flow-protection surface unevenness includes at least one of an exterior flow-protection wall, an interior flow-protection wall, an exterior flow-protection trench and an interior flow-protection trench.

9. The method as recited in claim 1, further comprising positioning the recess when forming the recess so the indentation is at least partially situated beneath a contacting side of at least one of a second bond layer and a second solder layer affixed to the second carrier device after one of fixedly bonding or fixedly solder the first carrier device to the second carrier device.

* * * * *